US011609267B2

(12) United States Patent
Houda et al.

(10) Patent No.: US 11,609,267 B2
(45) Date of Patent: Mar. 21, 2023

(54) IMMUNITY EVALUATION SYSTEM AND IMMUNITY EVALUATION METHOD

(71) Applicant: Hitachi, Ltd., Tokyo (JP)

(72) Inventors: Isao Houda, Tokyo (JP); Aya Ohmae, Tokyo (JP); Umberto Paoletti, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 5 days.

(21) Appl. No.: 17/455,580

(22) Filed: Nov. 18, 2021

(65) Prior Publication Data

US 2022/0268836 A1 Aug. 25, 2022

(30) Foreign Application Priority Data

Feb. 19, 2021 (JP) .............................. JP2021-025746

(51) Int. Cl.
*G01R 31/309* (2006.01)
*H05K 1/02* (2006.01)
*G01R 1/067* (2006.01)

(52) U.S. Cl.
CPC ........ *G01R 31/309* (2013.01); *G01R 1/06711* (2013.01); *H05K 1/0216* (2013.01)

(58) Field of Classification Search
CPC ........ G01R 1/04; G01R 1/07; G01R 31/2648; G01R 31/2808; G01R 31/302; G01R 31/303; G01R 31/307; G01R 31/312; G01R 31/002
See application file for complete search history.

(56) References Cited

U.S. PATENT DOCUMENTS

2013/0193984 A1\* 8/2013 Kim ................... G01R 29/0814
324/613
2015/0346254 A1\* 12/2015 Nara ................... G01R 29/0835
324/613

FOREIGN PATENT DOCUMENTS

JP          2005-207868 A      8/2005

\* cited by examiner

*Primary Examiner* — Tung X Nguyen
(74) *Attorney, Agent, or Firm* — Crowell & Moring LLP

(57) ABSTRACT

Provided is an immunity evaluation system that enables design feedback in consideration of a subject wiring and an improvement amount for improving an electromagnetic noise resistance of a circuit board. An immunity evaluation device includes: a storage unit configured to store characteristic data including probe-circuit board wiring coupling characteristics which are determined by a combination of a near-field probe and circuit board characteristics, and a test result; and an IC reaching signal level estimation unit configured to estimate a signal level reaching a terminal of an evaluation target IC. The immunity evaluation device receives board design information, information of the near-field probe, and test waveform instruction information of a signal applied to the near-field probe. The IC reaching signal level estimation unit reads the coupling characteristics from the storage unit based on the board design information of a test subject circuit board and the information of the near-field probe, and outputs a value of the IC reaching signal level reaching a terminal of the evaluation target IC from the board design information of the test subject circuit board, the information of the near-field probe, and the coupling characteristics.

7 Claims, 11 Drawing Sheets

FIG. 3

IMMUNITY TEST RESULT INFORMATION 600

| TEST ITEM | INTERFERING WAVE INFORMATION | | | THRESHOLD LEVEL |
| --- | --- | --- | --- | --- |
| | MODULATION | FREQUENCY | TEST LEVEL | |
| BUNDLED CURRENT INJECTION TEST (BCI TEST) | CW | 150MHz<br>160MHz<br>⋮ | 100dBuA<br>100dBuA<br>⋮ | 88dBuA<br>92dBuA<br>⋮ |
| | AM | 150MHz<br>160MHz<br>170MHz<br>⋮ | 100dBuA<br>100dBuA<br>100dBuA<br>⋮ | 90dBuA<br>94dBuA<br>96dBuA<br>⋮ |
| RADIATED ELECTROMAGNETIC FIELD IRRADIATION TEST | CW | 1200MHz<br>1250MHz<br>⋮ | 70V/m<br>70V/m<br>⋮ | 56V/m<br>60V/m<br>⋮ |
| | AM | 1200MHz<br>1250MHz<br>⋮ | 70V/m<br>70V/m<br>⋮ | 58V/m<br>64V/m<br>⋮ |

FIG. 4

FOUR-LAYER BOARD   30

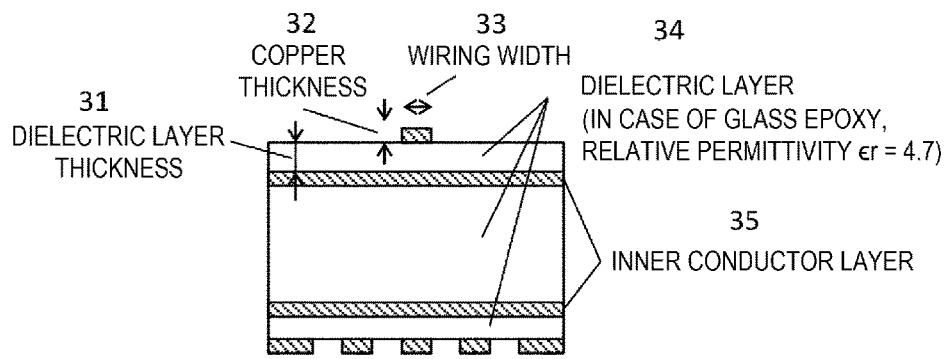

- 31 DIELECTRIC LAYER THICKNESS
- 32 COPPER THICKNESS
- 33 WIRING WIDTH
- 34 DIELECTRIC LAYER (IN CASE OF GLASS EPOXY, RELATIVE PERMITTIVITY $\epsilon r = 4.7$)
- 35 INNER CONDUCTOR LAYER

FIG. 5

APPLICATION PROBE INFORMATION   602

|  | PROBE INFORMATION | | | NOTE |
|---|---|---|---|---|
| PROBE USED | PROBE A | PROBE B | PROBE C | SELECT PROBE-WIRING COUPLING CHARACTERISTIC TABLE ACCORDING TO PROBE USED |
| PROBE-TO-BOARD DISTANCE (d) | 1mm | 0.5mm | 2mm | CONTROL z DIRECTION OF THREE-DIMENSIONAL ROBOT ARM SUCH THAT DISTANCE BETWEEN PROBE TIP AND BOARD SURFACE BECOMES VALUES ON LEFT |
| MAXIMUM INPUT RATING | 10W | 20W | 30W | POWER TO BE INPUT TO PROBE MAY BE LIMITED AT INPUT UNIT SO THAT APPLICATION PROBE INPUT POWER OF TEST WAVEFORM INFORMATION DOES NOT EXCEED RATINGS ON LEFT |

FIG. 6A

TEST WAVEFORM INFORMATION  603

| WAVEFORM TYPE (MODULATION METHOD) | MODULATION PARAMETER | FREQUENCY | FREQUENCY SWEEP STEP | RESIDENCE TIME | CORRESPONDING STANDARD |
|---|---|---|---|---|---|
| CONTINUOUS WAVE (CW) (CW: Continuous Wave) | UNMODULATED | 0.1MHz~3.2GHz | • FIXED TO ONLY SPECIFIC FREQUENCY | 2sec (APPLICATION TIME PER FREQUENCY) | IEC 61000-4-3 ISO 11452-2, 4 |
| AMPLITUDE MODULATION (AM) (AM: Amplitude modulation) | MODULATION FREQUENCY: 1kHz MODULATION DEGREE: 80% | 0.1MHz~800MHz | Or | | IEC 61000-4-3 ISO 11452-2, 4 |
| PULSE MODULATION (PM)-1 (PM: Pulse Modulation) | t on: 577µs PERIOD: 4600µs | 800MHz~1.2GHz, 1.4GHz~2.7GHz | • PERFORM FREQUENCY SWEEP IN STEP IN FIG. 6B | | ISO 11452-2 |
| PULSE MODULATION (PM)-2 (PM: Pulse Modulation) | t on: 3µs PERIOD: 3333µs | 1.2GHz~1.4GHz, 2.7GHz~3.2GHz | | | ISO 11452-2 |
| ELECTRICAL FAST TRANSIENT/ BURST | SEE FIG. 7A | | | 2min | IEC 61000-4-4 |

FIG. 6B

FREQUENCY SWEEP STEP

| FREQUENCY BAND MHz | LINEAR STEP MHz | LOGARITHMIC STEP % |
|---|---|---|
| 0.01~0.1 | 0.01 | 10 |
| 0.1~1 | 0.1 | 10 |
| 1~10 | 1 | 10 |
| 10~200 | 5 | 5 |
| 200~400 | 10 | 5 |
| 400~1000 | 20 | 2 |
| 1000~18000 | 40 | 2 |

TEST WAVEFORM FOR EACH MODULATION METHOD (CW, AM, PM)

IEC 61000-4-4 TEST WAVEFORM

FIG. 11A
SINGLE WIRING

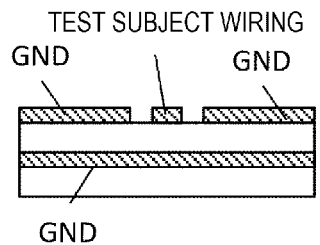

FIG. 11B
PARALLEL WIRING

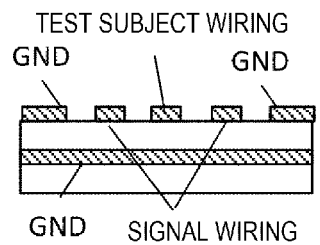

FIG. 12

PROBE-WIRING COUPLING CHARACTERISTIC TABLE 610

| TEST SUBJECT WIRING 610a | | | | | APPLICATION PROBE 610b | | |
|---|---|---|---|---|---|---|---|
| 610a1 | 610a2 | 610a3 | 610a4 | 610a5 | 610b1 | 610b2 | 610b3 |
| WIRING TYPE | WIRING WIDTH | COPPER THICKNESS | DIELECTRIC LAYER THICKNESS | RELATIVE PERMITTIVITY | PROBE A | PROBE B | PROBE C |
| SINGLE WIRING | 150um | 35um | 60um | 4.7 | COUPLING CHARACTERISTIC A-1 | COUPLING CHARACTERISTIC B-1 | COUPLING CHARACTERISTIC C-1 |
| | 200um | 35um | 60um | 4.7 | COUPLING CHARACTERISTIC A-2 | COUPLING CHARACTERISTIC B-2 | COUPLING CHARACTERISTIC C-2 |
| | ⋮ | ⋮ | ⋮ | ⋮ | ⋮ | ⋮ | ⋮ |
| PARALLEL WIRING | 150um | 35um | 60um | 4.7 | COUPLING CHARACTERISTIC A-1 | COUPLING CHARACTERISTIC B-1 | COUPLING CHARACTERISTIC C-1 |
| | 200um | 35um | 60um | 4.7 | COUPLING CHARACTERISTIC A-2 | COUPLING CHARACTERISTIC B-2 | COUPLING CHARACTERISTIC C-2 |
| | ⋮ | ⋮ | ⋮ | ⋮ | ⋮ | ⋮ | ⋮ |

IMMUNITY EVALUATION SYSTEM AND IMMUNITY EVALUATION METHOD

BACKGROUND OF THE INVENTION

1. Field of the Invention

The present invention relates to an immunity evaluation system and an immunity evaluation method, and particularly to an immunity evaluation system and an immunity evaluation method suitable for providing design feedback that indicates a subject wiring and an improvement amount for improving an electromagnetic noise resistance of a circuit board.

2. Description of the Related Art

With expansion of electronization and electrification of systems and equipment in industry, infrastructure, and in-vehicle fields, it is important to operate electronic systems and devices safely and securely over the long term and continue to provide values.

In such a situation, in order to ensure a long-term operation with high reliability and health during operation of a customer electronic system at a design stage, an external noise resistance (immunity performance) of an electronic device is required to be efficiently evaluated. For example, international standards (IEC62132-4 (Direct Power Injection (DPI) method) which is an evaluation method in which noise is directly injected into each terminal of an IC by capacitive coupling to check for malfunction, IEC62132-9 (surface scanning method), and the like) are used as methods for evaluating the immunity performance of an electronic device at a circuit board level, and commercially available tools that visualize a fragile part on the board are also commercialized.

As a surface scanning immunity evaluation system using a near-field probe, for example, there is a technique described in JP-A-2005-207868. A test apparatus of a semiconductor device described in JP-A-2005-207868 inputs a test pattern to an LSI under test, acquires an output pattern output from the LSI under test, and determines whether malfunction of the LSI under test occurs by comparing the output pattern with an expected value pattern.

The technique described in JP-A-2005-207868 of related art inputs the test pattern to the LSI under test, compares the output pattern with the expected value pattern, and determines whether malfunction of the LSI under test occurs. However, the technique described in JP-A-2005-207868 determines a malfunction during a test and cannot evaluate an improvement degree after a design change. In addition, since coupling between a probe and wiring and propagation characteristics of the wiring are not taken into consideration, it is impossible to grasp a signal level that actually reaches a terminal of a malfunctioning LSI. Therefore, even when this test apparatus is used, a quantitative design cannot be performed since the improvement degree due to circuit and layout design changes cannot be grasped in advance, and as a result, trial production and re-evaluation will be repeated, and extra development time and costs will be required.

SUMMARY OF THE INVENTION

An object of the invention is to provide an immunity evaluation system that enables design feedback in consideration of a subject wiring and an improvement amount for improving an electromagnetic noise resistance of a circuit board, and short-term and low-cost design feedback without repeating trial production that grasps in advance whether a design change is necessary and sufficient by estimating an improvement degree after a design change by analysis.

A configuration of the immunity evaluation system of the invention is preferably an immunity evaluation system that evaluates an electromagnetic resistance of an electronic circuit board by emitting electromagnetic waves from a near-field probe of a signal generation device, and includes a signal generation device that performs scanning with the near-field probe and generates a signal to be applied to the near-field probe; and an immunity evaluation device that controls a signal level of the signal to be applied to the near-field probe of the signal generation device, receives a test result of emitting the electromagnetic waves from the near-field probe, and evaluates the test result. The immunity evaluation device includes a storage unit configured to store characteristic data and the test result and an IC reaching signal level estimation unit configured to estimate a signal level reaching a terminal of an evaluation target IC, and receives board design information of a test subject circuit board, information of the near-field probe, and test waveform instruction information of the signal applied to the near-field probe. The characteristic data stored in the storage unit includes coupling characteristics between the probe and the circuit board wiring which are determined by a combination of the near-field probe and circuit board characteristics. The IC reaching signal level estimation unit reads the coupling characteristics from the storage unit based on the board design information of the test subject circuit board and the information of the near-field probe, estimates an IC reaching signal level that reaches a terminal of the evaluation target IC from the board design information of the test subject circuit board, the information of the near-field probe and the coupling characteristics, and outputs an IC reaching signal level estimated value.

The invention can provide an immunity evaluation system that enables design feedback in consideration of a subject wiring and an improvement amount for improving an electromagnetic noise resistance of a circuit board, and short-term and low-cost design feedback without repeating trial production that grasps in advance whether a design change is necessary and sufficient by estimating an improvement degree after a design change by analysis.

BRIEF DESCRIPTION OF THE DRAWINGS

FIG. 3 is a diagram illustrating an example of immunity test result information.

FIG. 4 is a diagram illustrating an example of a structure of an evaluation subject board.

FIG. 5 is a diagram illustrating an example of application probe information.

FIG. 6A is a diagram illustrating an example of test waveform information.

FIG. 6B is a diagram illustrating data for each frequency in a frequency sweep step.

FIGS. 11A and 11B are diagrams illustrating states of wiring in a test subject circuit board.

FIG. 12 is a diagram illustrating an example of a probe-wiring coupling characteristic table.

DESCRIPTION OF THE PREFERRED EMBODIMENTS

Hereinafter, embodiments according to the invention will be described with reference to FIGS. 1 to 15.

First Embodiment

Hereinafter, a first embodiment according to the invention will be described with reference to FIGS. 1 to 14.

First, the configuration and outline of operation of the immunity evaluation system according to the first embodiment will be described with reference to FIGS. 1 and 2.

The outline of a process for improving a design in consideration of an electromagnetic resistance by an immunity evaluation system 1 will be described below.

First, an immunity evaluation device calculates coupling characteristics of a probe and wiring and propagation characteristics from the probe that applies a signal to an IC terminal on an evaluation subject board for each application point based on design information of the evaluation subject board design information to estimate a signal level reaching the IC terminal, and stores the signal level in a main memory. In this way, the immunity evaluation device applies an interference signal while performing scanning with the probe to monitor an occurrence state of memory access errors and communication errors. Then, the immunity evaluation device maps a fragile part in a form such as an error rate distribution at each application point of signals by the probe and outputs the fragile part as a fragile part map on a screen.

A designer of the board grasps areas and traces (wiring) having problems on the board and feeds them back to a wiring design.

The designer calculates a required improvement amount from a result of a prior immunity test (RF irradiation, or the like), reviews the design of the board based on the above-described fragile part map, and then re-estimates the signal level reaching the IC terminal based on the design information after the design is improved. Then, the designer determines whether the improvement is sufficient from a difference between the IC reaching signal level estimated values before and after a design change and the required improvement amount, and reviews the redesign.

As described above, the immunity evaluation system 1 is a system that irradiates a test subject circuit board 10 with an electromagnetic field noise signal such as a high frequency signal or static electricity from the outside and examines the influence thereof. Here, the test subject circuit board is a test subject electronic circuit board for an immunity evaluation test. As illustrated in FIG. 1, the immunity evaluation system 1 includes an immunity evaluation device 100 and a signal generation device 200.

Figure 1:
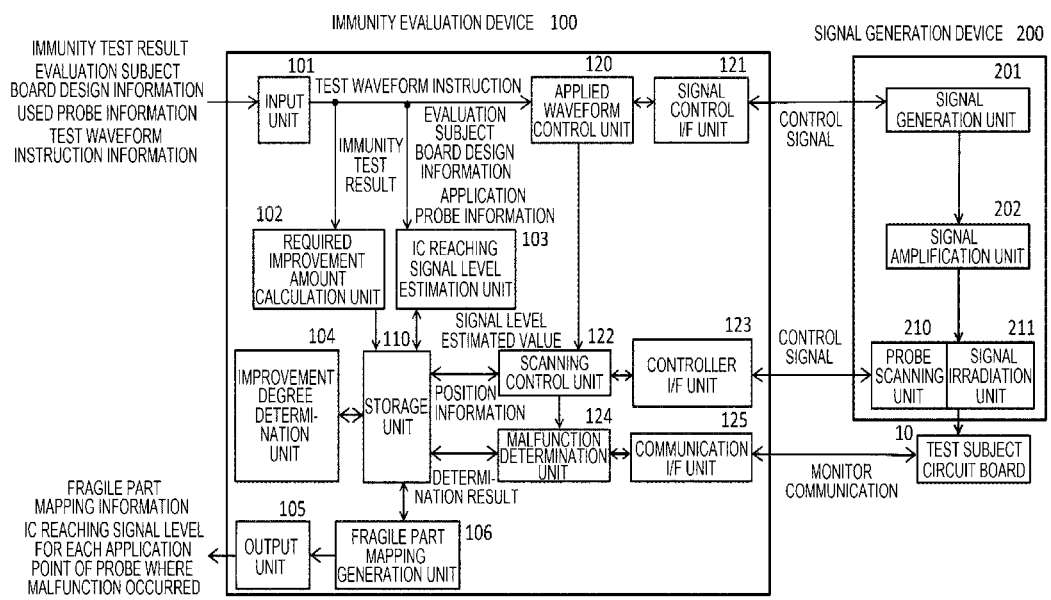
FIG. 1 is a block diagram illustrating a functional configuration of an immunity evaluation system according to a first embodiment.

The immunity evaluation device 100 is a device that controls the signal generation device 200, receives output information from the test subject circuit board 10, and evaluates an influence of signal irradiation on the test subject circuit board 10, and includes an input unit 101, a required improvement amount calculation unit 102, an IC reaching signal level estimation unit 103, an improvement degree determination unit 104, an output unit 105, a fragile part mapping generation unit 106, a storage unit 110, an applied waveform control unit 120, a signal control I/F unit 121, a scanning control unit 122, a controller I/F unit 123, a malfunction determination unit 124, and a communication I/F unit 125, as illustrated in FIG. 1.

The input unit 101 is a functional unit configured to input an immunity test result, evaluation subject board design information, application probe (the "application probe" means a probe that applies a signal to the test subject circuit board 10, and the same applies hereinafter) information, test waveform instruction information, and the like to the immunity evaluation device 100 from the outside. The required improvement amount calculation unit 102 is a functional unit configured to calculate a required improvement amount of design for specifications of the evaluation subject board 10 from the immunity test result. The IC reaching signal level estimation unit 103 is a functional unit configured to estimate a reaching signal level to a semiconductor device on the test subject circuit board 10 from the evaluation subject board design information and the application probe information, and output the reaching signal level as a signal level estimated value. The improvement degree determination unit 104 is a functional unit configured to emit a signal and determine an improvement degree of how much each of the specifications of the evaluation subject board 10 has been improved by a next signal irradiation test when an immunity evaluation is performed by the immunity evaluation device 100 and the design of the test subject circuit board 10 is changed. The output unit 105 is a functional unit configured to output fragile part mapping information and an IC reaching signal level for each of application points of a probe where an operation failure occurred. The fragile part mapping generation unit 106 is a functional unit configured to generate mapping information indicating a fragile part with respect to an external signal of evaluation subject board 10. The storage unit 110 is a functional unit configured to store data and work data input to the immunity evaluation device 100. The applied waveform control unit 120 is a functional unit configured to control a signal to be applied to the test subject circuit board 10. The signal control I/F unit 121 is a functional unit configured to perform an interface process between the applied waveform control unit 120 and a signal generation unit 201. The scanning control unit 122 is a functional unit configured to control scanning of the probe. The controller I/F unit 123 is a functional unit configured to perform an interface process between the scanning control unit 122 and a probe scanning unit. The malfunction determination unit 124 is a functional unit configured to determine a possibility of a malfunction of the test subject circuit board 10 based on a result of the signal irradiation test. The communication I/F unit 125 is a functional unit configured to perform an interface process between the test subject circuit board 10 and the malfunction determination unit 124.

The signal generation device 200 is a device that irradiates the test subject circuit board 10 with a signal, and as illustrated in FIG. 1, includes a signal generation unit 201, a signal amplification unit 202, a probe scanning unit 210, and a signal irradiation unit 211.

The signal generation unit 201 is a functional unit configured to generate a signal to be applied to the test subject circuit board 10. The signal amplification unit 202 is a functional unit configured to amplify the signal generated by the signal generation unit 201. The probe scanning unit 210 is a functional unit configured to perform scanning with a probe that applies a signal in a three-dimensional (x, y, z) direction. The signal irradiation unit 211 is a functional unit configured to irradiate the test subject circuit board 10 with a signal for testing.

Figure 2:
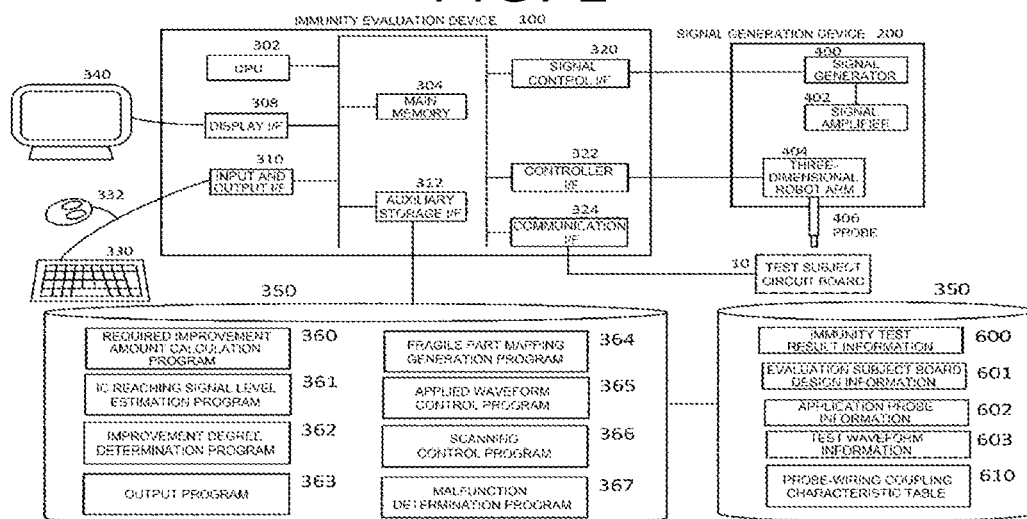
FIG. 2 is a hardware and software configuration diagram of the immunity evaluation system according to the first embodiment.

The hardware configuration of the immunity evaluation device 100 is implemented by, for example, a general information processing device such as a personal computer illustrated in FIG. 2.

The immunity evaluation device 100 is in a form in which a central processing unit (CPU) 302, a main memory 304, a display I/F 308, an input and output I/F 310, an auxiliary storage I/F 312, a signal control I/F 320, a controller I/F 322, and a communication I/F 324 are connected by a bus.

The CPU 302 controls each unit of the immunity evaluation device 100, and loads a program required for the main memory 304 to execute the program.

The main memory 304 usually includes a volatile memory such as a RAM, and stores the program executed by the CPU 302 and data to be referred to.

The display I/F 308 is an interface that connects a display device 340 such as a liquid crystal display (LCD).

The input and output I/F 310 is an interface that connects an input and output device. In the example of FIG. 2, a keyboard 330 is connected with a mouse 332 of a pointing device.

The auxiliary storage I/F 312 is an interface that connects an auxiliary storage device such as a hard disk drive (HDD) 350 or a solid state drive (SSD).

The HDD 350 has a large storage capacity and stores a program for executing the present embodiment. In the immunity evaluation device 100, a required improvement amount calculation program 360, an IC reaching signal level estimation program 361, an improvement degree determination program 362, an output program 363, a fragile part mapping generation program 364, an applied waveform control program 365, a scanning control program 366, and a malfunction determination program 367 are installed.

The required improvement amount calculation program 360, the IC reaching signal level estimation program 361, the improvement degree determination program 362, the output program 363, the fragile part mapping generation program 364, the applied waveform control program 365, the scanning control program 366, and the malfunction determination program 367 are programs that execute the functions of the required improvement amount calculation unit 102, the IC reaching signal level estimation unit 103, the improvement degree determination unit 104, the output unit 105, the fragile part mapping generation unit 106, the storage unit 110, the applied waveform control unit 120, the scanning control unit 122, the malfunction determination unit 124, respectively.

The signal control I/F 320 is, for example, an interface circuit configured to control a signal generated by a signal generator 400 of the signal generation device 200 according to a general purpose interface bus (GPIB) standard.

The controller I/F 322 is an interface circuit configured to control a three-dimensional robot arm of the signal generation device 200 by, for example, Ethernet (registered trademark).

The communication I/F 324 is an interface circuit configured to monitor and communicate a measurement result of the test subject circuit board 10 by, for example, a controller area network (CAN) and I2C.

The signal generation device 200 is a circuit in which a signal amplifier 402 amplifies a signal generated by the signal generator 400 which is hardware. A three-dimensional robot arm 404 is a robot arm configured to perform scanning with a probe 406 that applies a signal in the three-dimensional (x, y, z) direction. The probe 406 is a needle-shaped portion configured to generate a signal to be applied to the test subject circuit board 10.

Next, data used in the immunity evaluation system will be described with reference to FIGS. 3 to 7B.

Immunity test result information 600 is, for example, failure occurrence information (frequency, required improvement amount) obtained by an immunity test. FIG. 3 illustrates an example when a test item is a bundled current injection test (BCI test) and a radiated electromagnetic field irradiation test.

Here, interfering wave information is information that lists a modulation method, frequency, and a test level of an interfering wave in which an error (failure operation) occurred in the immunity test. A threshold level is a level at which errors do not occur when an interference wave level is lowered in order in the modulation method/frequency in which an error occurs at the test level. Then, a difference between the test level and the threshold level is a minimum required improvement amount. Specifically, if a unit representing the signal level is dB, subtraction (for example, 100 dBuA−88 dBuA=12 dB required for reduction) is performed, and if it is V/m, division (for example, 56÷70=0.8→20% required for reduction) is performed.

Evaluation subject board design information 601 is basic design information of the evaluation subject board 10, and for example, when described by a four-layer board 30 illustrated in FIG. 4, the evaluation target board design information 601 includes printed circuit board (PCB) layout (board CAD) data, PCB layout tool data, a test subject wiring name (including coordinates of wiring and a wiring width 33 included in the PCB layout data and the PCB layout tool data), board configuration (a board layer configuration (four-layer board), a copper thickness 32, a dielectric constant of a dielectric layer 34 (for example, when the dielectric layer is a glass epoxy material, a relative permittivity is 4.7), a dielectric layer thickness 31, the configuration of an inner conductor layer 35, or the like), a material of the board, an input and output impedance characteristic of mounted components with respect to the test subject wiring, or the like.

Application probe information 602 is information about the probe 406 that applies a signal, and is, for example, a probe for use, a probe-to-board distance, and a maximum input rating. FIG. 5 illustrates a specific example of the application probe information.

Test waveform information 603 is information regarding a waveform of a signal given to the evaluation subject board 10 by the probe 406. FIG. 6A illustrates specifications for each waveform type (modulation method) and corresponding standards, and FIG. 6B illustrates data for each frequency in a frequency sweep step. Further, FIGS. 7A and 7B illustrate specific examples of waveforms given in FIG. 6A.

Figure 7A:
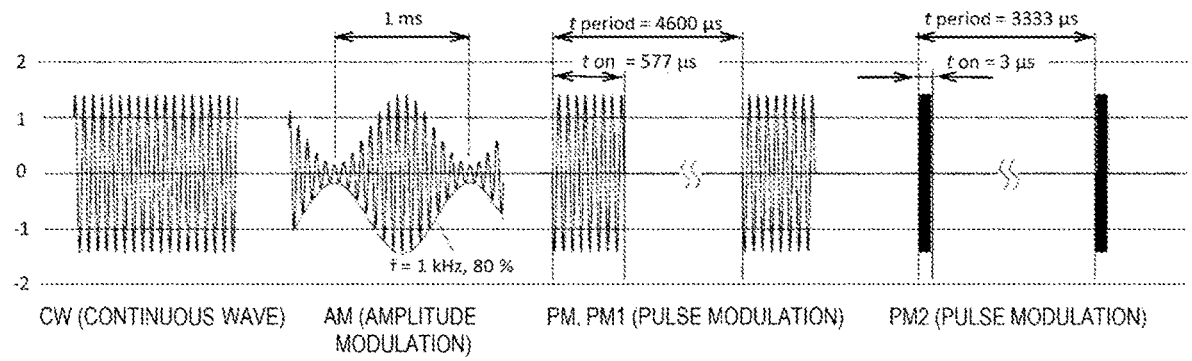
FIG. 7A is a diagram illustrating waveforms for modulation methods (CW, AM, PM).
Figure 7B:
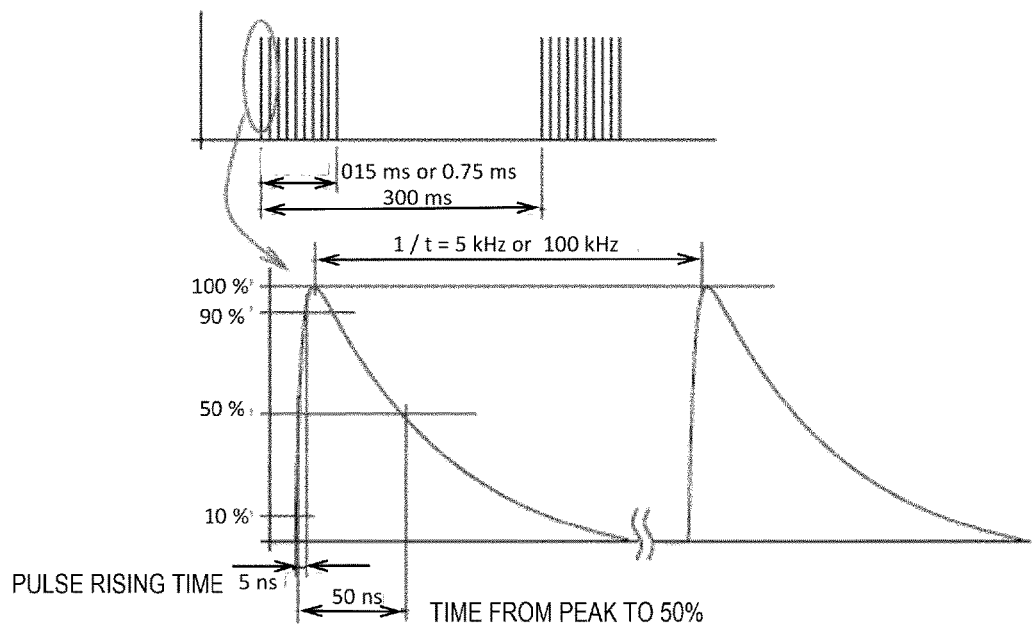
FIG. 7B is a diagram illustrating a waveform of an IEC61000-4-4 standard.

FIG. 7A illustrates an example of waveforms in continuous wave (CW) modulation, amplitude modulation (AM) modulation, and pulse modulation (PM) modulation. Further, FIG. 7B illustrates an example of a waveform of an electrical fast transient burst immunity test with an IEC61000-4-4 standard in the immunity test.

Figure 8:
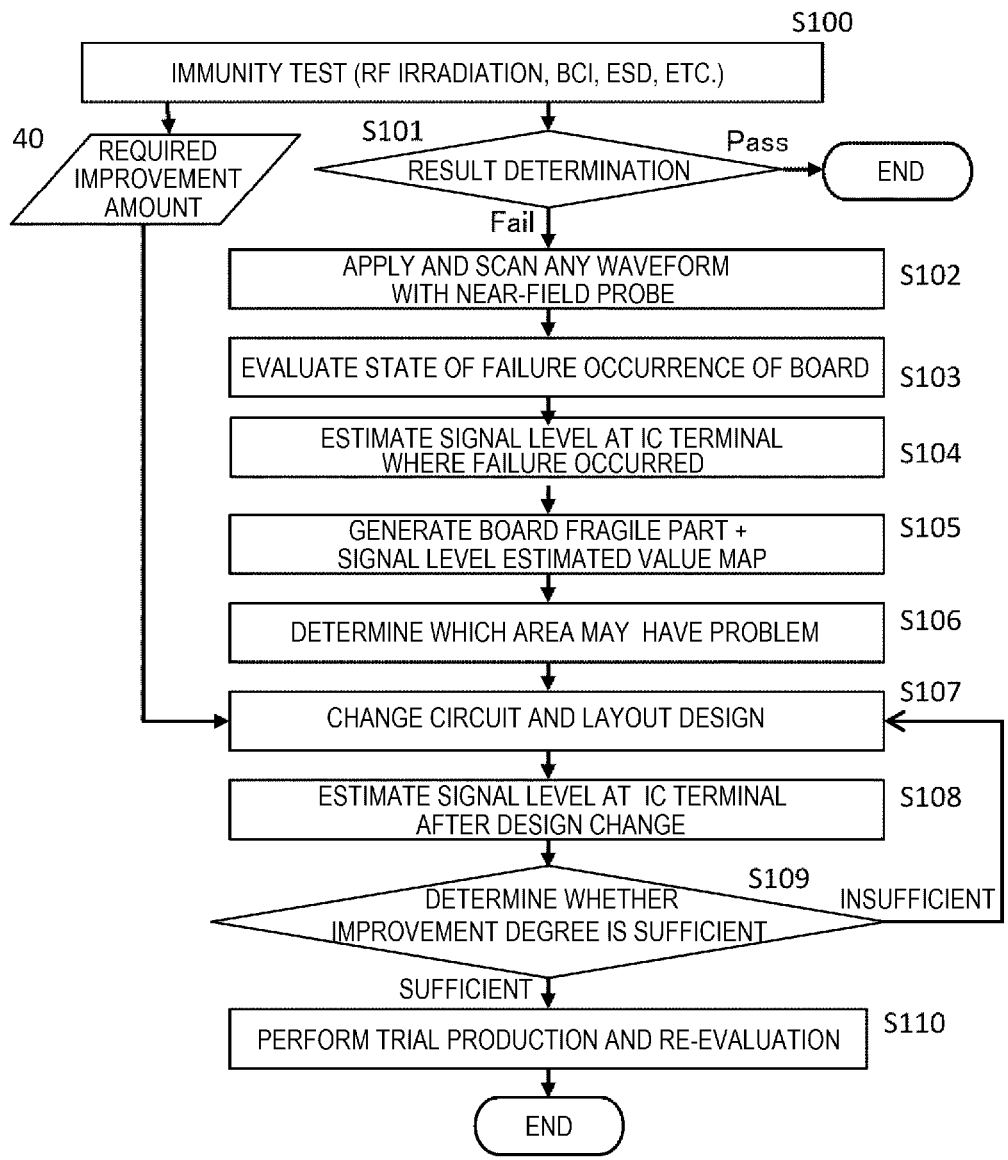
FIG. 8 is a flowchart illustrating a series of processes for improving a design of a board in consideration of an electromagnetic resistance by an immunity evaluation system.

Next, a series of processes for improving the design of a board in consideration of the electromagnetic resistance by the immunity evaluation system will be described with reference to FIG. 8. FIG. 8 is a flowchart illustrating the series of processes for improving the design of a board in consideration of the electromagnetic resistance by the immunity evaluation system.

First, an inspector conducts an immunity test (radio frequency (RF) (high frequency) irradiation, bulk current injection (BCI) (bundling current injection), electro-static discharge (ESD) (static electricity), or the like) on a test subject circuit board (S100).

Then, the inspector determines a test result (S101), ends the process when the test result is pass (S101: pass), and the process proceeds to S102 when the test result is fail (S101: fail).

Next, as instructed by the inspector, the immunity evaluation system applies and scans a signal of the instructed waveform to the test subject circuit board 10 by a near-field probe (S102).

Next, the immunity evaluation system evaluates a state of failure occurrence of the test subject circuit board 10 (S103).

Next, the immunity evaluation system estimates the signal level at an IC terminal where a failure occurred (S104).

Next, the immunity evaluation system generates a fragile part on the board+signal level estimated value map (S105).

Next, the designer determines which area is likely to have a problem based on the map (S106), and changes a circuit and layout design (S107). When the circuit and layout design is changed, the value of a required improvement amount 40 with respect to the signal level obtained by the immunity test is also referred to.

Next, the immunity evaluation system re-estimates the signal level at the IC terminal for the test subject circuit board 10 after the design change (S108).

Then, the designer determines whether the improvement degree is sufficient after the design change (S109). When the improvement degree is sufficient (S109: sufficient), trial production and re-evaluation on the board is performed (S110), and when the improvement degree is insufficient (S109: insufficient), the process returns to the step of changing the circuit and layout design of S107.

Next, process details of the IC reaching signal level estimation unit will be described with reference to FIGS. 9 to 12.

Figure 9:
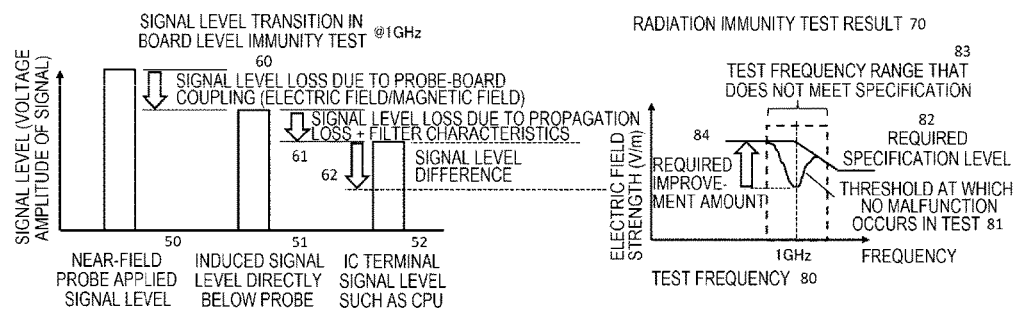
FIG. 9 is a diagram illustrating a concept of quantifying an improvement amount of a signal level by grasping an IC reaching signal level.

First, a concept of quantifying the improvement amount of the signal level by grasping the IC reaching signal level will be described with reference to FIG. 9. FIG. 9 is a diagram illustrating a near-field probe applied signal level 50, an induced signal level 51 directly below probe, and an IC terminal signal level 52 in comparison with an electric field strength of a radiation immunity test result 70.

It is assumed that this radiation immunity test is a test for verifying whether malfunction of a test subject circuit board with a test frequency 80 at around 1 GHz occurred. As a radiation immunity test result, it is assumed that a graph of a threshold 81 at which no malfunction occurs in the test as illustrated in FIG. 9 is obtained in a test frequency range 83. This means that in the test frequency range 83, malfunction does not occur in the test subject circuit board at the electric field strength below the graph of the threshold 81 at which no malfunction occurs, and malfunction occurs in the test subject circuit board at the electric field strength above the graph of the threshold 81 at which no malfunction occurs. Then, a required improvement amount 84 for the electromagnetic resistance in the test frequency range 83 is a difference between a maximum value and a minimum value in the test frequency range 83.

Meanwhile, the near-field probe applied signal level 50 is a signal level that can be actually instructed by the immunity evaluation device 100, and has a difference of a signal level loss 60 due to probe-board coupling (electric field and magnetic field) with the induced signal level 51 directly below probe. The IC terminal signal level 52 is a signal level that actually reaches an IC terminal of a CPU, a FPGA, a RAM, or the like, and has a difference of a signal level loss 61 due to propagation loss+filter characteristics with the induced signal level 51.

Here, if the IC terminal signal level 52 can be estimated, the required improvement amount 84 for the electromagnetic resistance in the test frequency range 83 is obtained according to a signal level difference 62 between a value of the IC terminal signal level 52 at the maximum value in the test frequency range 83 and a value of the IC terminal signal level 52 at the minimum value in the test frequency range 83.

Figure 10:
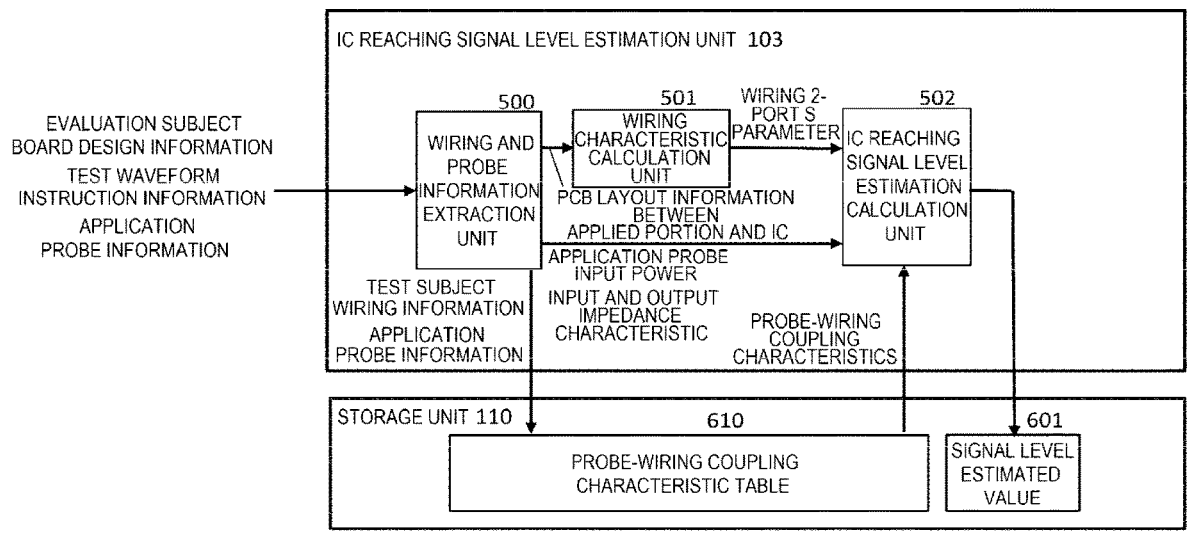
FIG. 10 is a diagram illustrating a more detailed functional structure of an IC reaching signal level estimation unit and a storage unit, and a data flow between blocks.

Next, the detailed configuration and details of a process of the IC reaching signal level estimation unit will be described with reference to FIG. 10. As described above, the IC reaching signal level estimation unit 103 is a functional unit configured to estimate a reaching signal level to a semiconductor device on the test subject circuit board 10 from the evaluation subject board design information and the application probe information, and output reaching signal level as a signal level estimated value, and more specifically, the IC reaching signal level estimation unit 103 includes a wiring and probe information extraction unit 500, a wiring characteristic calculation unit 501, and an IC reaching signal level estimation calculation unit 502, as illustrated in FIG. 10.

The wiring and probe information extraction unit 500 is a functional unit configured to extract necessary wiring information about the evaluation subject board and information about the probe for use from the evaluation subject board design information, the test waveform instruction information, and the application probe information to be input. The wiring characteristic calculation unit 501 is a functional unit configured to calculate required wiring characteristics based on the information to be input from the wiring and probe information extraction unit 500. The IC reaching signal level estimation calculation unit 502 is a functional unit configured to calculate the signal level that reaches an IC based on the wiring information and the information about the probe for use extracted by the wiring and probe information extraction unit 500, and the wiring characteristics calculated by the wiring characteristic calculation unit 501.

Meanwhile, the storage unit 110 stores a probe-wiring coupling characteristic table 610. The probe-wiring coupling characteristic table 610 is a table that stores the coupling characteristics for each combination of the wiring information of the test subject circuit board and the application probe. In addition, a specific example of the probe-wiring coupling characteristic table 610 will be described later.

The wiring and probe information extraction unit 500 receives the evaluation subject board design information, the test waveform instruction information, and the application probe information, acquires corresponding probe-wiring coupling characteristics with reference to the probe-wiring coupling characteristic table 610, and outputs the corresponding probe-wiring coupling characteristics to the IC reaching signal level estimation calculation unit 502. The wiring and probe information extraction unit 500 outputs an application probe input power and the input and output impedance characteristic to the IC reaching signal level estimation calculation unit 502.

Further, the wiring and probe information extraction unit 500 outputs PCB layout information between a portion to which a signal is applied by the probe and the IC to the wiring characteristic calculation unit 501.

The wiring characteristic calculation unit 501 calculates a wiring 2-port S parameter based on the input PCB layout information between a portion to which a signal is applied by the probe and the IC to the IC reaching signal level estimation calculation unit 502. Here, the S parameter (scattering parameter) is a parameter representing the characteristics of a subject circuit by a scattering degree of a wave when an AC signal is regarded as the wave.

The IC reaching signal level estimation calculation unit 502 outputs an IC reaching signal level estimated value 601 and writes the IC reaching signal level estimated value 601 into the storage unit 110 based on the input wiring 2-port S parameter from the input wiring characteristic calculation unit 501, the probe-wiring coupling characteristics input from the wiring and probe information extraction unit 500, the application probe input power, and the input and output impedance characteristic.

Next, the probe-wiring coupling characteristic table will be described with reference to FIGS. 11 and 12.

The probe-wiring coupling characteristic table 610 is a table that stores information on the probe-wiring coupling characteristics, and has fields of a test subject wiring 610a and an application probe 610b as illustrated in FIG. 12.

The test subject wiring 610a has subfields of a wiring type 610a1, a wiring width 610a2, a copper thickness 610a3, a dielectric layer thickness 610a4, and a relative permittivity 610a5. The wiring type 610a1 includes a single wiring (FIG. 11A) and a parallel wiring (FIG. 11B).

The single wiring is a case where there is one signal wiring between GNDs, and the parallel wiring is a case where a plurality of signal wirings between GNDs run in parallel. In addition, in the case of FIG. 11B, three signal wirings run in parallel, and the middle wiring is illustrated as a test subject wiring.

The application probe 610b retains the coupling characteristics for each test subject wiring for each subfield representing each type of the probe to be used.

For example, in a test subject circuit board having the wiring type 610a1 of a "single wiring", the wiring width 610a2 of "160 μm", the copper thickness 610a3 of "35 nm", the dielectric layer thickness 610a4 of "60 μm", and the relative permittivity 610a5 of "4.7", a "coupling characteristic A-1" is retained when the application probe 610b is "probe A".

Next, a concept of wiring ports and coupling characteristics of the test subject circuit board will be described with reference to FIG. 13.

Figure 13A:
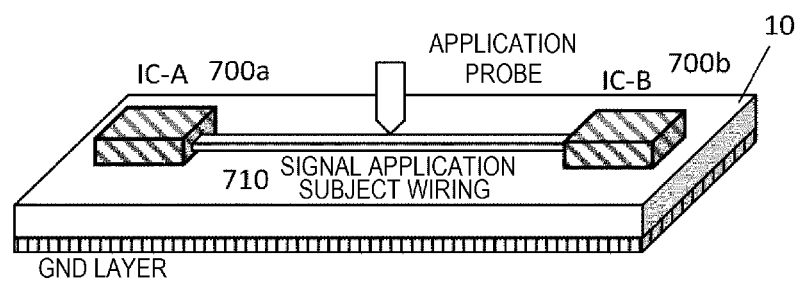
FIGS. 13A and 13B are diagrams illustrating a specific example of wiring ports and coupling characteristics of a test subject circuit board.

Here, as illustrated in FIG. 13A, a case is considered where an IC-A 700a and an IC-B 700b are mounted on the test subject circuit board 10, a wiring connecting the IC-A 700a and the IC-B 700b is a signal application subject wiring 710, and a signal is applied to the wiring by a probe.

Figure 13B:
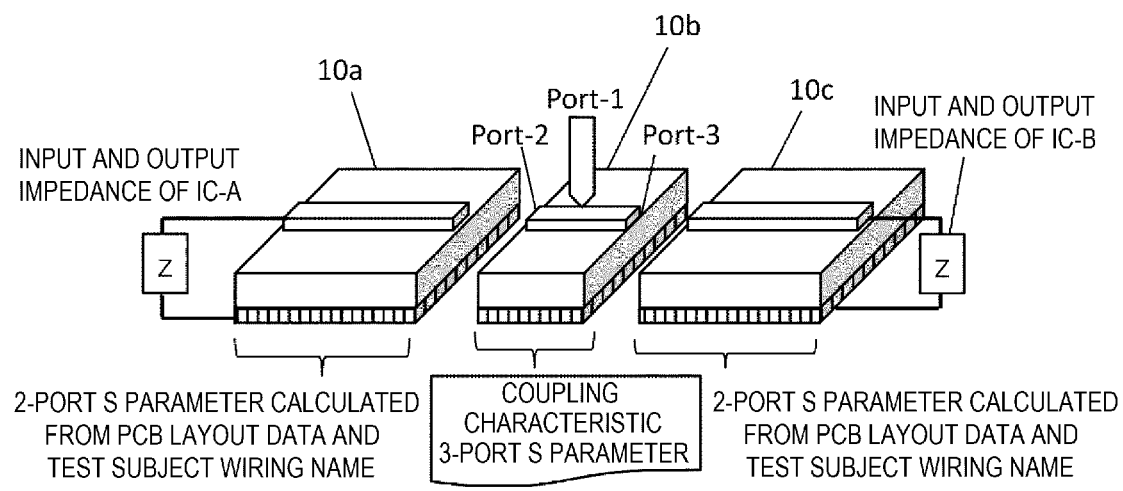

At this time, as illustrated in FIG. 13B, in the case of application to wirings between ICs, an influence on the vicinity of application points, an influence on the wirings, and an input and output impedance for the ICs are considered separately.

In a vicinity portion 10a of the wiring of the IC-A of the test subject circuit board 10, the 2-port S parameter calculated from the PCB layout data and the test subject wiring name and the input and output impedance of the IC-A are obtained. The same applies to a vicinity portion 10c of the wiring of the IC-B.

A vicinity portion 10b of the wiring at the signal application point is represented by a 3-port S parameter as a coupling characteristic because the probe counted as one port is combined with the wirings at both ends to form three ports.

Figure 14:
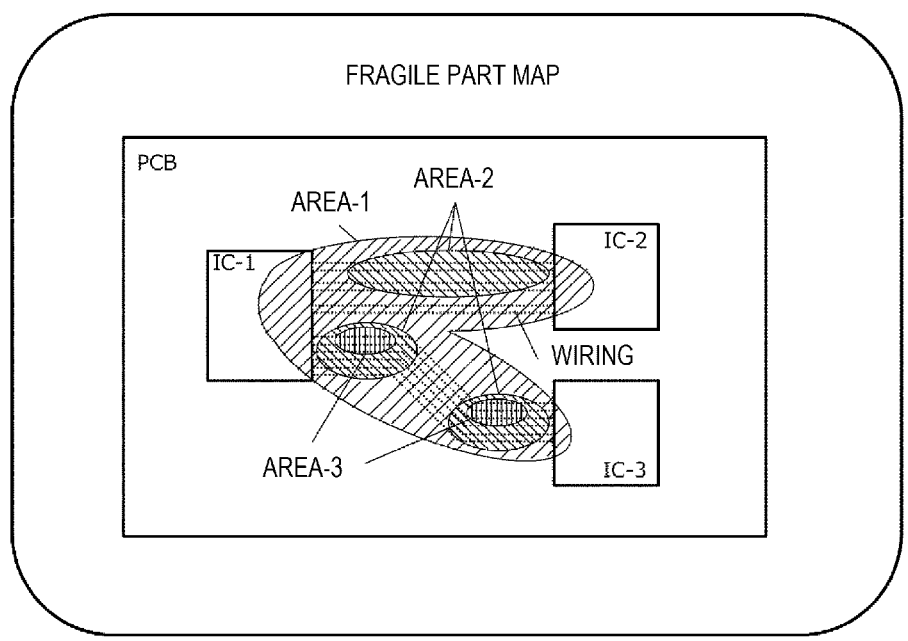
FIG. 14 is a diagram illustrating an example of a display screen of a fragile part map.

Next, an example of the fragile part map output as a result of an immunity evaluation will be described with reference to FIG. 14. The fragile part map is a map illustrating the fragile part of the test subject circuit board 10 output from the immunity evaluation device 100. The fragile part map displays, for example, a failure occurrence application point, an error occurrence rate distribution, and the IC terminal reaching signal level estimated value when a failure occurs.

The immunity evaluation device 100 performs scanning with the application probe, color-codes areas according to an error occurrence rate that occurs when a specified signal level is applied, superimposes the areas on an image of the board, and displays it on the display device 340 or the like of the immunity evaluation device 100. In the example of FIG. 14, when an IC-1, an IC-2, and an IC-3 are mounted on the board, for example, a yellow-green area-1 (error occurrence frequency is less than 10%), a yellow area-2 (error occurrence frequency is 10% or more and less than 30%), and a red area-3 (error occurrence frequency is 30% or more) indicate an error occurrence frequency by color.

Further, although not illustrated, the IC terminal reaching signal level estimated value may be popped up by pointing a cursor on the screen with the mouse 332 or the like.

As described above, according to the immunity evaluation system of the present embodiment, the propagation characteristics from the signal level input by the probe to the IC terminal are calculated for each application point based on the evaluation subject board design information to estimate the signal level reaching the IC terminal. Accordingly, it is possible to grasp the signal level that actually reaches a terminal of a malfunctioning IC, clarify the improvement degree required in the circuit and layout design, grasp in advance whether the design change is sufficient, and reduce extra development time and costs by repeating trial production and re-evaluation.

Second Embodiment

Figure 15:
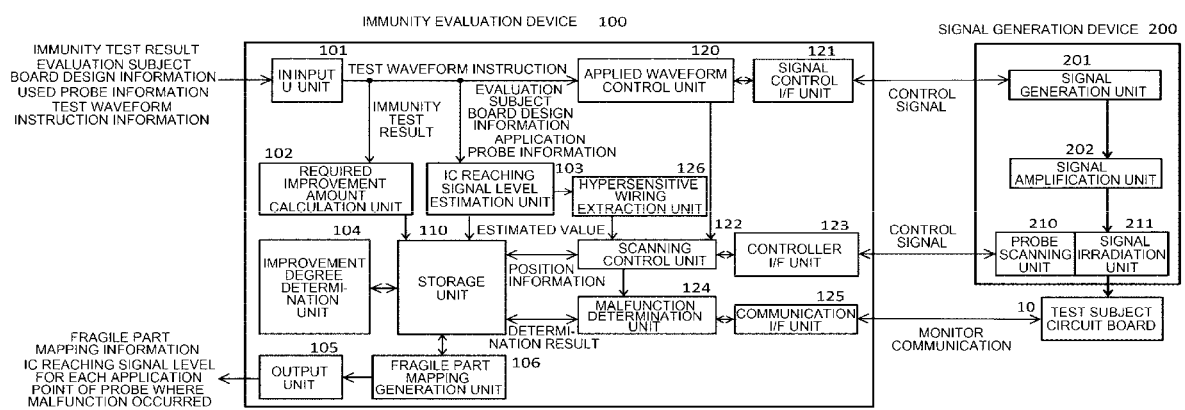
FIG. 15 is a block diagram illustrating a functional configuration of an immunity evaluation system according to a second embodiment.

Hereinafter, a second embodiment according to the invention will be described with reference to FIG. 15.

The first embodiment describes the immunity evaluation system in which the signal is input from the probe and the propagation characteristics to the IC terminal are calculated for each application point based on the evaluation subject board design information, and the signal level reaching the IC terminal is estimated, so that the design feedback can be performed by clarifying the improvement degree required in the circuit and layout design and presenting it to the designer as the fragile map.

The present embodiment relates to an immunity evaluation system that can extract wirings that are prone to error due to an external electromagnetic change for the test subject circuit board and clarify a wiring that needs to be redesigned, in addition to the immunity evaluation system of the first embodiment.

Hereinafter, differences will be described based on the immunity evaluation system of the first embodiment.

In the immunity evaluation system of the present embodiment, a hypersensitive wiring extraction unit 126 is newly added to the immunity evaluation device 100.

The hypersensitive wiring extraction unit 126 extracts wirings that are sensitive to external noises or wirings in which error occurrence may have a significant effect on a device operation based on the IC reaching signal level estimated value output from the IC reaching signal level estimation unit 103 and the board design information ((Board CAD), a layer configuration (copper thickness, permittivity, or the like), a material, a wiring width, mounted parts, load characteristics, an analysis model of an electronic circuit board (an input and output buffer information specification (IBIS) model, a SPICE model)).

Accordingly, it is possible to shorten an evaluation time and improve a reliability of the device by focusing on an evaluation of the extracted wirings.

What is claimed is:

1. An immunity evaluation system configured to evaluate an electromagnetic resistance of an electronic circuit board by emitting electromagnetic waves from a near-field probe of a signal generation device, the immunity evaluation system comprising:
    a signal generation device configured to perform scanning with the near-field probe and generate a signal to be applied to the near-field probe; and
    an immunity evaluation device configured to control a signal level of the signal to be applied to the near-field probe of the signal generation device, receive a test result of emitting the electromagnetic waves from the near-field probe, and evaluate the test result, wherein
    the immunity evaluation device includes:
        a storage unit configured to store characteristic data and the test result; and
        an IC reaching signal level estimation unit configured to estimate a signal level reaching a terminal of an evaluation target IC,
    the immunity evaluation device receives board design information of a test subject circuit board, information of the near-field probe, and test waveform instruction information of the signal applied to the near-field probe,
    the characteristic data stored in the storage unit includes a probe-circuit board wiring coupling characteristic which is determined by a combination of the near-field probe and a circuit board characteristic, and
    the IC reaching signal level estimation unit reads the coupling characteristic from the storage unit based on the board design information of the test subject circuit board and the information of the near-field probe, estimates an IC reaching signal level that reaches a terminal of the evaluation target IC from the board design information of the test subject circuit board, the information of the near-field probe and the coupling characteristic, and outputs an IC reaching signal level estimated value.

2. The immunity evaluation system according to claim 1, wherein
    the immunity evaluation device further includes:
        a malfunction determination unit configured to monitor an occurrence state of an error as a result of emitting the electromagnetic waves from the near field probe; and
        a fragile part mapping generation unit configured to generate a fragile part map that represents a fragile part of the test subject circuit board, and
    the fragile part mapping generation unit outputs the fragile part map.

3. The immunity evaluation system according to claim 2, wherein
    the fragile part map displays an error rate at a probe application point where a failure occurred.

4. The immunity evaluation system according to claim 2, wherein
    the fragile part map outputs the IC reaching signal level estimated value estimated and output by the IC reaching signal level estimation unit.

5. The immunity evaluation system according to claim 1, wherein
    the immunity evaluation device receives prior immunity test result information and includes a required improvement amount calculation unit configured to calculate, based on the immunity test result information and the IC reaching signal level estimated value estimated and output by the IC reaching signal level estimation unit, an improvement amount required for passing a test for the IC reaching signal level estimation unit and the test subject circuit board, and
    the required improvement amount calculation unit calculates and outputs the improvement amount required for passing the test for the test subject circuit board.

6. The immunity evaluation system according to claim 1, wherein
    the immunity evaluation device further includes a hypersensitive wiring extraction unit configured to extract information on problematic wiring of the test subject circuit board based on the design information of the test subject circuit board.

7. An immunity evaluation method by an immunity evaluation system that evaluates an electromagnetic resistance of an electronic circuit board by emitting electromagnetic waves from a near-field probe of a signal generation device, the immunity evaluation system including:
    a signal generation device configured to perform scanning with the near-field probe and generate a signal to be applied to the near-field probe; and
    an immunity evaluation device configured to control a signal level of the signal to be applied to the near-field probe of the signal generation device, receive a test result of emitting the electromagnetic waves from the near-field probe, and evaluate the test result;
    the immunity evaluation device including:
        a storage unit configured to store characteristic data and the test result;
        an IC reaching signal level estimation unit configured to estimate a signal level reaching a terminal of an evaluation target IC;
        a required improvement amount calculation unit configured to calculate and output an improvement amount required for passing a test for the test subject circuit board; and
        an improvement degree determination unit configured to compare two improvement amounts and determine whether the improvement is sufficient, wherein
    the characteristic data stored in the storage unit includes a probe-circuit board wiring coupling characteristic which is determined by a combination of the near-field probe and a circuit board characteristic, the immunity evaluation method comprising:

a step of the immunity evaluation device receiving prior immunity test result information, board design information of a test subject circuit board, information of the near-field probe, and test waveform instruction information of the signal applied to the near-field probe;

a step of the required improvement amount calculation unit calculating and outputting the improvement amount required for passing the test for the test subject circuit board based on the prior immunity test result information;

a step of the IC reaching signal level estimation unit reading the coupling characteristic from the storage unit based on the board design information of the test subject circuit board and the information of the near-field probe, estimating an IC reaching signal level that reaches a terminal of the evaluation target IC from the board design information of the test subject circuit board, the information of the near-field probe and the coupling characteristic, and outputting a first IC reaching signal level estimated value;

a step of the IC reaching signal level estimation unit reading the coupling characteristic from the storage unit based on the board design information of the test subject circuit board after a design change and the information of the near-field probe, estimating an IC reaching signal level that reaches a terminal of the evaluation target IC from the board design information of the test subject circuit board after the design change, the information of the near-field probe and the coupling characteristic, and outputting a second IC reaching signal level estimated value; and a step of the improvement degree determination unit calculating a difference between the first IC terminal reaching signal level estimated value and the second IC terminal reaching signal level estimated value, and determining an improvement by comparing the difference with the required improvement amount calculated by the required improvement amount calculation unit.

* * * * *